United States Patent [19]
Korleski

[11] Patent Number: 5,545,475
[45] Date of Patent: Aug. 13, 1996

[54] MICROFIBER-REINFORCED POROUS POLYMER FILM AND A METHOD FOR MANUFACTURING THE SAME AND COMPOSITES MADE THEREOF

[75] Inventor: Joseph E. Korleski, Newark, Del.

[73] Assignee: W. L. Gore & Associates, Newark, Del.

[21] Appl. No.: 498,488

[22] Filed: Jul. 5, 1995

Related U.S. Application Data

[63] Continuation-in-part of Ser. No. 309,374, Sep. 20, 1994, abandoned.

[51] Int. Cl.$^6$ .................................................... C08L 67/00
[52] U.S. Cl. ............................. 428/306.6; 428/308.4; 428/311.1; 428/314.4; 428/317.9; 428/320.2; 525/151; 525/153; 525/165
[58] Field of Search .................................. 525/151, 153, 525/165; 428/306.6, 308.4, 311.1, 314.4, 317.9, 320.2

[56] References Cited

U.S. PATENT DOCUMENTS

| | | |
|---|---|---|
| 3,723,373 | 3/1973 | Lucas . |
| 4,325,903 | 4/1982 | Wissbrun et al. . |
| 4,333,907 | 6/1982 | Urasaki et al. . |
| 4,417,020 | 11/1983 | Bailey et al. . |
| 4,429,078 | 1/1984 | Cogswell et al. . |
| 4,871,595 | 10/1989 | Lusignea et al. . |
| 4,914,156 | 4/1990 | Howe . |
| 4,975,312 | 12/1990 | Lusignea et al. . |
| 5,264,523 | 11/1993 | Honda et al. . |
| 5,283,110 | 2/1994 | Gardner et al. . |
| 5,348,990 | 9/1994 | Walpita et al. . |

FOREIGN PATENT DOCUMENTS

| | | |
|---|---|---|
| 0051933 | 5/1982 | European Pat. Off. . |
| 0612610 | 8/1994 | European Pat. Off. . |
| 94/28069 | 12/1994 | WIPO . |

OTHER PUBLICATIONS

"Encyclopedia of Polymer Science and Engineering" Second Edition, 1985, John Wiley & Sons, Inc.
"In–Situ Composites Based On Thermoplastic and Thermotropic Liquid Crystalline Polymers", Bull. Soc. Chim. Belg. vol. 99, 1990, pp. 1031–1044.
"Liquid Crystalline Polymers", vol. 9, pp. 1–61, date: unknown.
"High Temperature Liquid Crystalline Copolyester Composites Part I: A Review and New Data for the Self–Reinforced Matrix Phase," Author: Paul D. Frayer, Polymer Composites, Dec. 1987, vol. 8, No. 6, pp. 379–395.
"Films From Liquid Crystals?", Authors: L. D. Thomas and D. D. Roth, Reprinted from CHEMTECH, 1990 20, pp. 546–550.

*Primary Examiner*—Patrick Ryan
*Assistant Examiner*—Richard Weisberger
*Attorney, Agent, or Firm*—Gary A. Samuels

[57] ABSTRACT

A porous composite sheet is prepared from a mixture of polytetrafluoroethylene particulates and liquid crystal polymer particulates. The liquid crystal polymer in the porous composite sheet can be in the form of particulates contained within a polytetrafluoroethylene microstructure, or formed into a network of liquid crystal polymer fibers contained within and attached to the polytetrafluoroethylene microstructure. The porous composite sheet can be used as a self-reinforced porous sheet, for example, as a filter media. The pores of the composite sheet can be at least partially filled with polymeric resins and the composite sheet laminated to form useful electronic assemblies such as printed circuit boards and the like.

10 Claims, 8 Drawing Sheets

COPPER 16

COPPER 16

COPPER 16

OTHER THERMOPLASTICS

LCP

MICROFIBER-REINFORCED POROUS POLYMER FILM AND A METHOD FOR MANUFACTURING THE SAME AND COMPOSITES MADE THEREOF

RELATED APPLICATIONS

This application is a continuation-in-part of application Ser. No. 08/309,374, filed Sept. 20, 1994, now abandoned.

FIELD OF THE INVENTION

The invention relates to porous expanded polytetrafluoroethylene films, and more specifically to porous films reinforced with liquid crystal polymer fibers.

BACKGROUND OF THE INVENTION

It is known that porous expanded polytetrafluoroethylene (ePTFE) as is taught in U.S. Pat. No. 3,543,566 has many uses, such as breathable, water repellent membranes, filters, electrical insulation and the like. It is also well known that the properties of plastics can, in general, be modified by addition of various filler materials. Fluoropolymer materials such as ePTFE and the like are attractive candidates for electrical packaging applications because of their low dielectric constant, low moisture pickup and excellent thermal resistance; however, they exhibit poor dimensional stability and very high coefficient of thermal expansion (CTE). As such, it is desirable to modify the fluoropolymer substrate to achieve suitable properties. One such way is to add microfiber reinforcement into the ePTFE structure.

However, it has been difficult to make thin films of micro-fiber reinforced ePTFE because as the material thickness is reduced the filler/fiber particulate creates pinholes and tears. Furthermore, the presence of reinforcement fiber, particularly at levels above 10% (v/v) and especially microfiber, makes mixing and paste extrusion processing of these composites very difficult. It would be desirable to make very thin films of ePTFE which are free of pinholes and also have high strength and fiber reinforcement.

It is well known that inclusion of fiber can provide many desirable attributes to a composite such as decreased shrinkage, reduced creep, reduced coefficient of thermal expansion, etc. (Enclyclopedia of Polymer Science, McGraw Hill). Liquid crystal polymers (LCPs) show promise as a candidate to be used as fiber reinforcement due to their high modulus, low coefficient of thermal expansion (CTE) and low moisture absorbtion. In situ formation of LCP microfiber reinforcement in a polymer alloy so as to reinforce the molded or cast article by forming LCP fibrils is also described in the literature, in fact, commercially available thermoplastics have been blended and reinforced with liquid crystal polymers. (See, for example, S. L. Kwolek, et al., "Encyclopedia of Polymer Science, 2nd Ed., 9, p. 1. See, also, G. Crevecoeur and G. Broeninchx, Bull, Soc. Chim. Belg., 99 (11–12), 1990, p. 103). Composites of LCP with ePTFE have not been made heretofore because ePTFE is not melt processible, i.e, it is not readily processed in a thermoplastic fashion. It would be extremely useful to combine the desirable properties of ePTFE with the reinforcement of LCP.

Finally, thin films of liquid crystal polymers are taught in U.S. Pat. No. 4,325,903 to Wissbrun, et al. who extruded fiber of molded article of LCP by first heating, then cooling to just near the melting temperature of the LCP. L. P. Thomas and D. D. Roth (Chemtech, 20, (1990) p. 546) describe both anisotropic and balanced films of LCP; and in U.S. Pat. No. 4,333,907 to Urasaki, et al. is taught a melt-molded film entirely of LCP and a process of stretching a coherent film at T>Tg. However, it is difficult to process LCPs—undesirable anisotropic properties are very difficult to eliminate in a film, especially an extruded film. The undesirable anisotropy leaves the film very notch-sensitive and typically produces a thin skin on the surface of the film, which is easy to peel away. The anisotropy is commonly reduced by increasing the amount of non-reactive filler into the LCP domain. (Foyer, P. D. Polymer Composites, 8(6) (1987) p. 379.

A flexible printed wiring board (PWB) substrate consisting of a film of LCP and/or a two phase interpenetrating network (IPN) with another thermoplastic is taught in U.S. Pat. No. 4,975,312 to Lusignea, et al. Here a substrate of a coherent, non-porous film having a tailored coefficient of thermal expansion (CTE) in the X-Y plane and thickness of less than 4 mil was produced by means of a counter rotating circular annular die method of extruding the LCP blends with other thermoplastics. The rotation, of the counter-rotating mandrels creates transverse shear flows that superimpose on the axial shear developed as the polymer melt is extruded through the die—the result is biaxial orientation. However, films made in such a manner are all non-porous, coherent composites. It would be very desirable to have a porous, microfiber reinforced composite for membrane filtration purposes, or to imbibe a second resin into the pores of the film to greatly enhance the conformability, adhesion to other materials and/or dielectric constant. Also, there is very little z-directionality to the LCP orientation in these teachings, even though it would be very desirable property to have.

SUMMARY OF THE INVENTION

It has now been discovered a novel porous composite sheet can be made comprising a porous PTFE microstructure of nodes interconnected with fibrils and a liquid crystal polymer material dispersed in the microstructure. Depending on the processing temperature, distinct embodiments of the invention are obtained An embodiment of the invention is made by blending PTFE particulate with LCP particulate and forming a porous tape in which the LCP particulate is contained within a porous microstructure of PTFE. The porous tape can be used as made, or serve as a preform which is then stretched at a temperature either above or below the melt temperature of the LCP. If the stretching is below the melt temperature of the LCP, then the PTFE expands to form a porous structure, but the LCP particulate remains in particulate form. If the composite material is stretched above the melt temperature of the LCP, then the LCP is expanded at the same time the PTFE is being stretched and is formed into a network of LCP fibers contained within and attached to the PTFE microstructure The high strength of porous expanded PTFE (which is greater than that of ordinary unexpanded PTFE) is further greatly enhanced by the network of oriented LCP fibers. Certain embodiments of the invention display remarkable physical properties such as matrix tensile strength of as high as 500,000 psi or more, surprisingly low CTE, e.g. as low as 10 ppm/°C. or less, and shrinkage as low as 0.1% after 1 hour at 200° C. Furthermore, the porous composite tapes can be filled with a polymeric resin. The polymeric resin can be a thermosetting or thermoplastic polymer.

The LCP fine powders used in the present invention are preferably main chain liquid crystals of the nematic type. Either thermotropic or lyotropic LCP can be used, however, the thermotropic type is preferred. The amount of LCP in the porous composite sheet is in the range 2 to 85 volume percent, preferably in the range 15 to 55 volume percent. By volume percent, as used herein, is meant the concentration of a material on a void-free basis.

The porous composite sheet or film of the invention can be used as a filter or self-reinforced membrane; or can be laminated to a backing material. It can also be laminated to a layer of metal, for example, a metal foil in which circuitry can be etched to form a printed wiring board (PWB); or it can be imbibed with a thermosetting or thermoplastic polymer resin, replacing all or part of the pore volume with such resin, for use in printed circuit board assemblies.

A method for making the porous composite sheet comprises the steps of:

(a) Mixing liquid crystal polymer particulate with polytetrafluoroethylene particulate, (b) lubricating the mixture of liquid crystal polymer particulate and polytetrafluoroethylene particulate with a lubricant to form a paste, (c) calendering, or extruding and optionally calendering, said paste to form a sheet, (d) removing said lubricant from said sheet, thereby providing a porous composite sheet comprising liquid crystal polymer particulate contained in a porous polytetrafluoroethylene microstructure.

BRIEF DESCRIPTION OF THE DRAWINGS

The operation of the present invention should become apparent from the following description when considered in conjunction with the accompanying drawings.

DETAILED DESCRIPTION OF THE INVENTION

Figure 1:
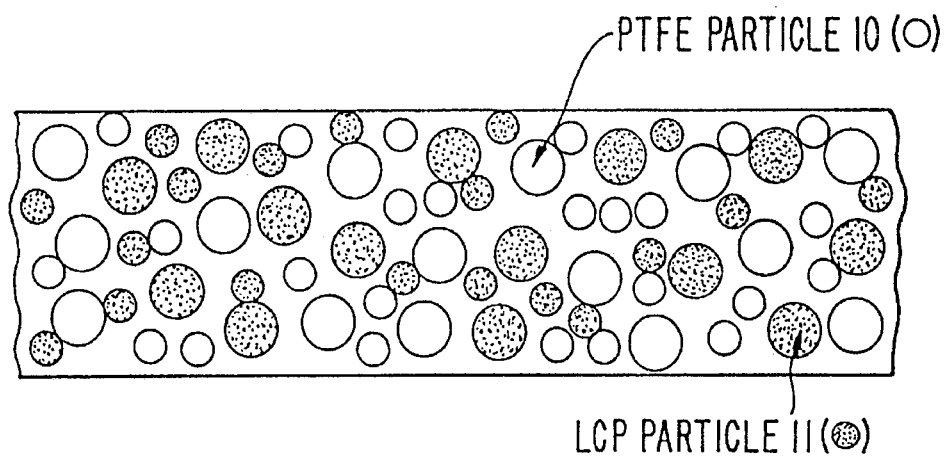
FIG. 1 is a cross-sectional schematic view of dried coagulum cake prior to lubrication.
Figure 2:
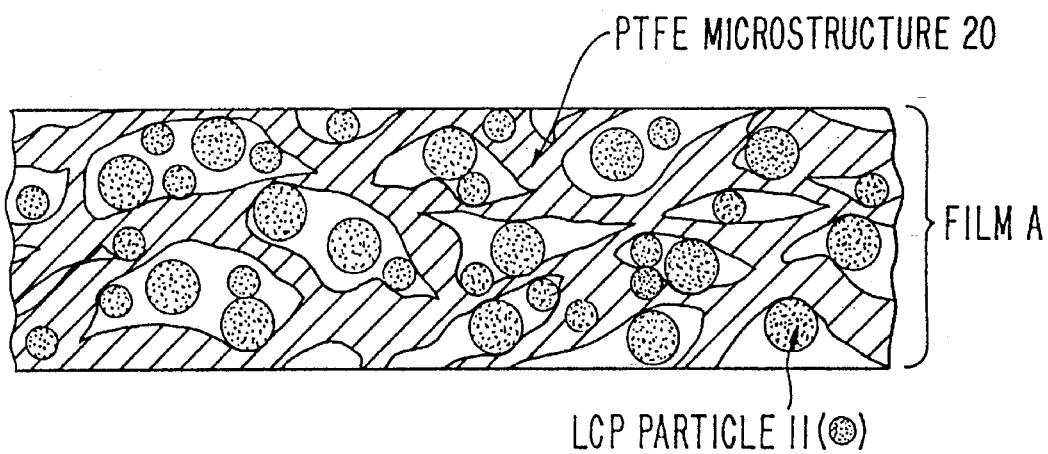
FIG. 2 is a cross-sectional view of an extruded unstretched porous sheet (Film A) of the invention.
Figure 3:
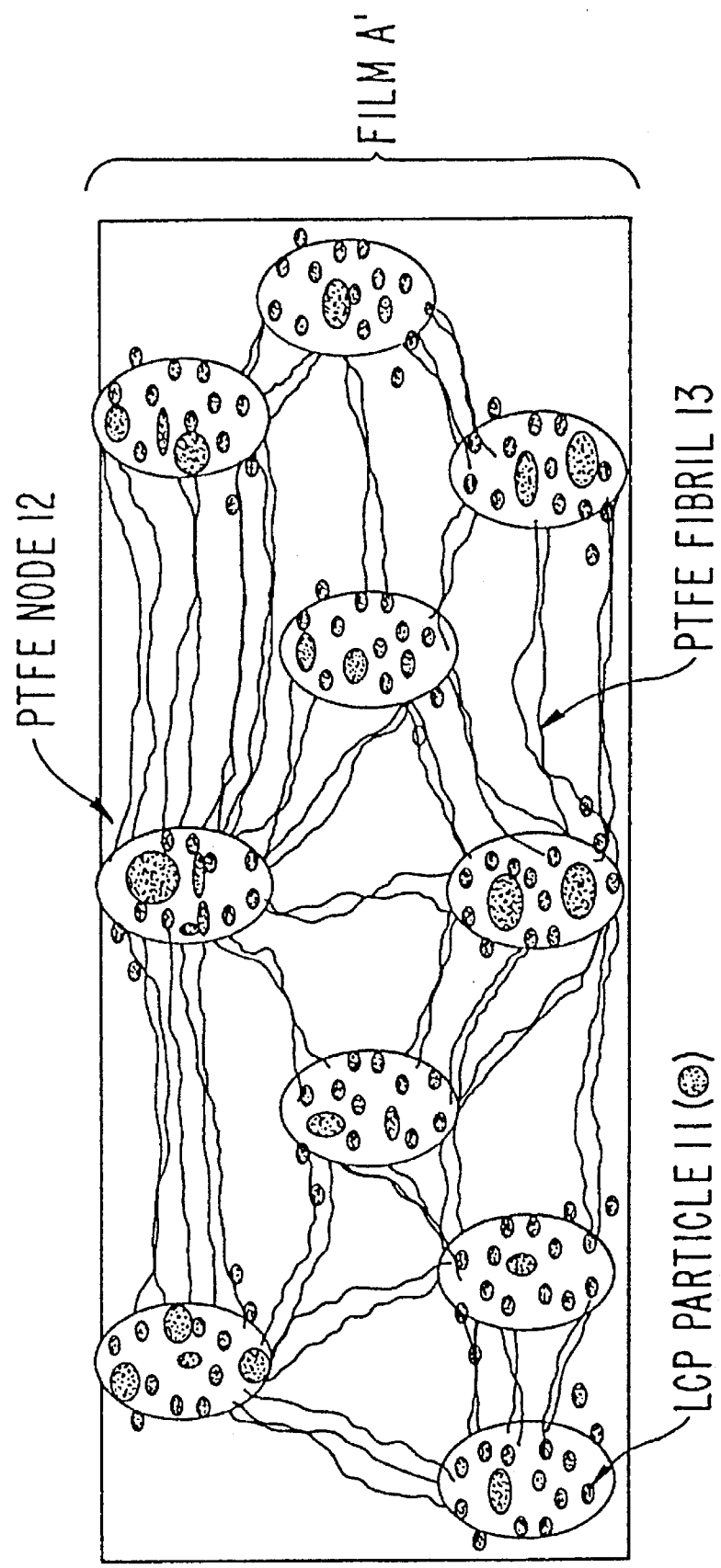
FIG. 3 is a cross-sectional view of Film A', which is the sheet of FIG. 2 after it is stretched at a temperature below the melting point of the LCP.
Figure 5:
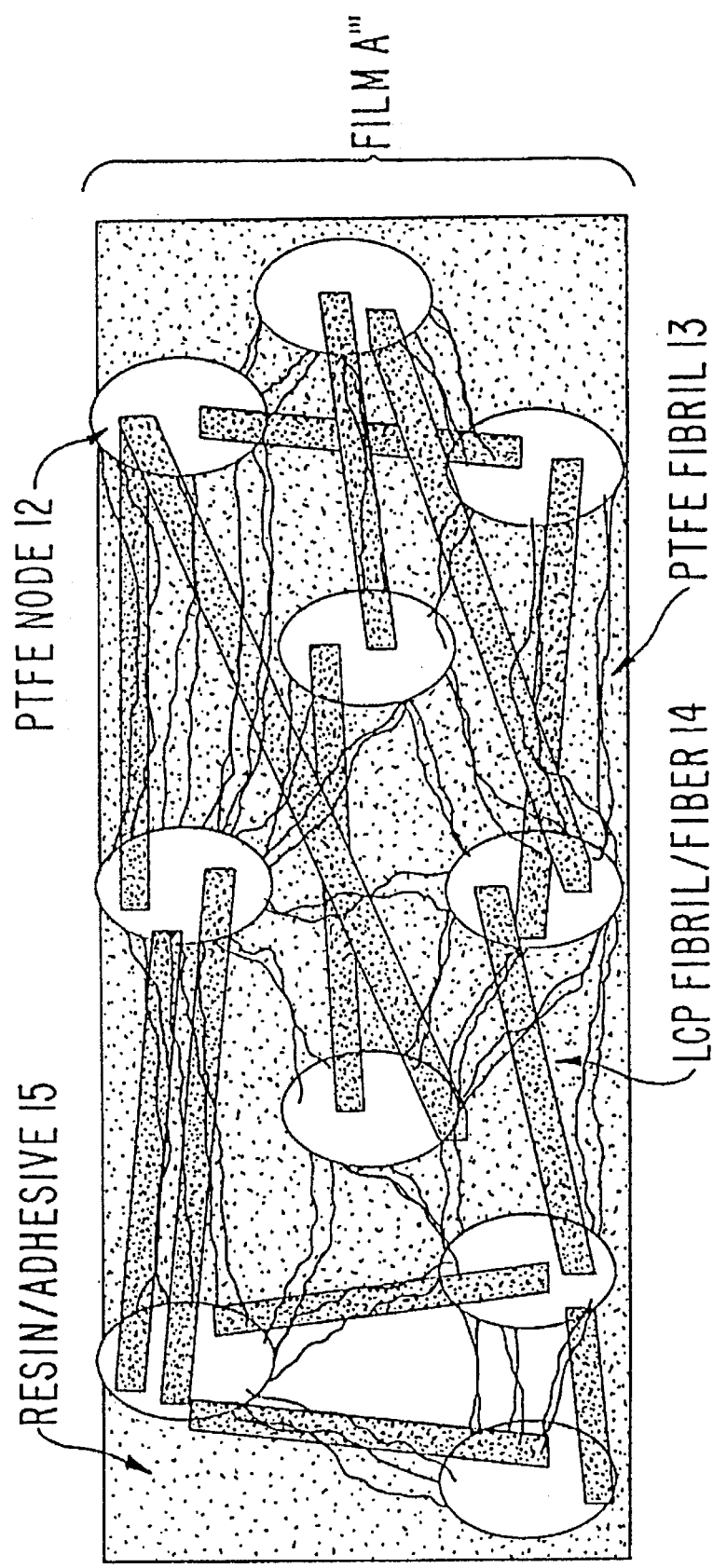
FIG. 5 is a cross-sectional view of the structure of Film A''', which is the film of FIG. 4 in which the pores are filled with an adhesive polymer resin 15.
Figure 6:
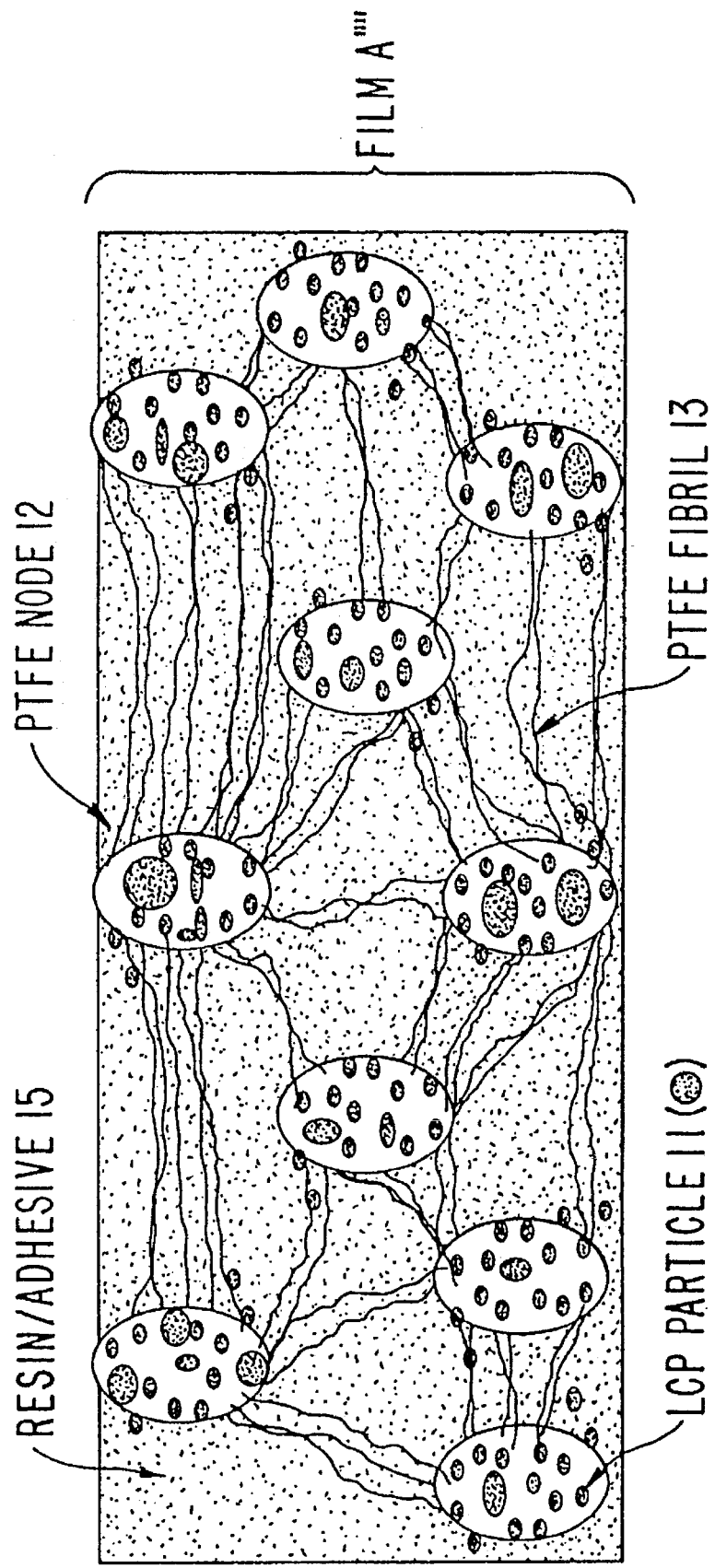
FIG. 6 is a cross-sectional view of the structure of Film A'''', which is the film of FIG. 3 in which the pores are filled with an adhesive polymer resin 15.
Figure 7:
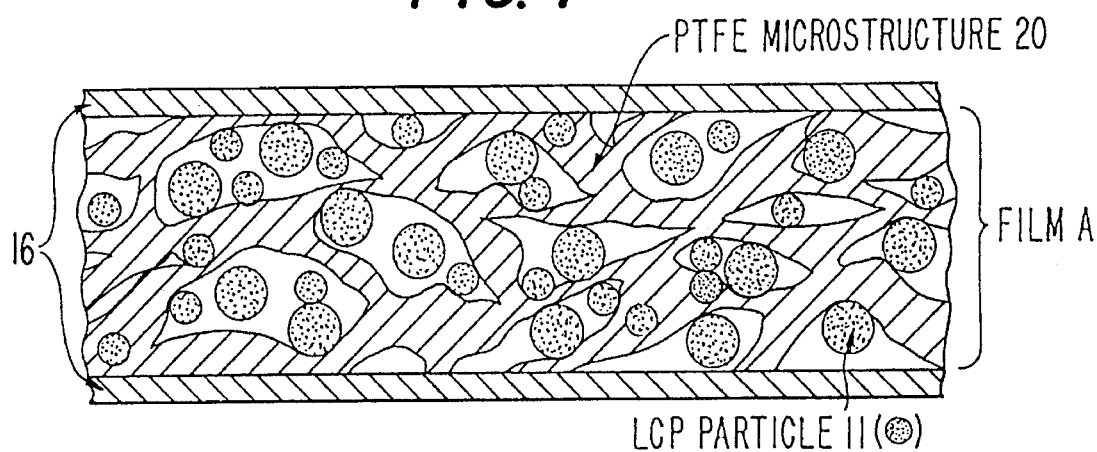
FIG. 7 is a cross-sectional view of the structure of Film A of FIG. 2 with metal layers 16 bonded on both sides.
Figure 8:
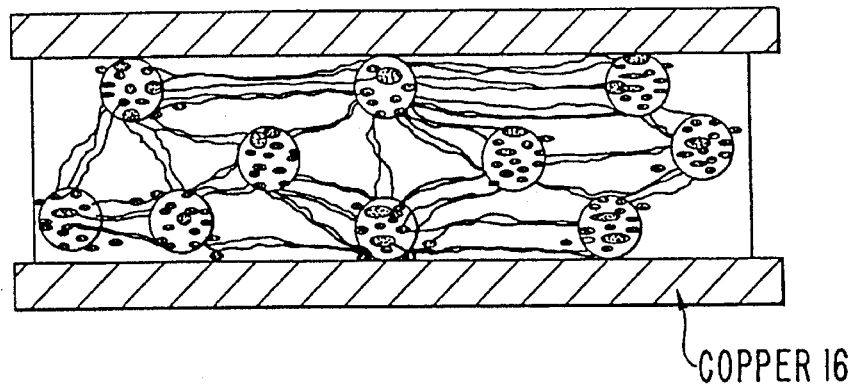
FIG. 8 is a cross-sectional view of Film A' of FIG. 3 with metal layers 16 bonded on both sides.

The invention is described more fully by reference to FIGS. 1 through 11. In FIG. 1 is shown a mixture of LCP particulate filler 11 and PTFE particulate 10 made by commonly known means, as for example, tumbling or co-coagulation as described in U.S. Pat. No. 4,985,296 (to Mortimer, Jr.), included herein by reference. To facilitate formation of the thin films of this invention, the particulate size of the fillers should average 40 microns or less. By "particulate" is meant individual particulates of any aspect ratio and thus includes fibers and powders. In FIG. 2 is shown a porous film (Film A) made by a paste forming process also described in U.S. Pat. No. 4,985,296. Film A can be used per se, e.g. by laminating to at least one surface of a metal layer 16, such as copper, to provide a useful printed wiring board (PWB) substrate as illustrated in FIG. 7. In FIG. 3 is shown Film A of FIG. 2 stretched below the melting point of the LCP to form Film A' with the expanded or stretched PTFE film microstructure of nodes 12 interconnected with fibrils 13 in which LCP particulate 11 is contained. Thus, FIG. 3 illustrates the porous node and fibril structure of expanded polytetrafluoroethylene (ePTFE) film wherein the LCP is still in particulate form. Film A' of FIG. 3 can then be laminated to at least one surface of a metal layer 16 to provide a useful PWB substrate as illustrated in FIG. 8.

Figure 4:
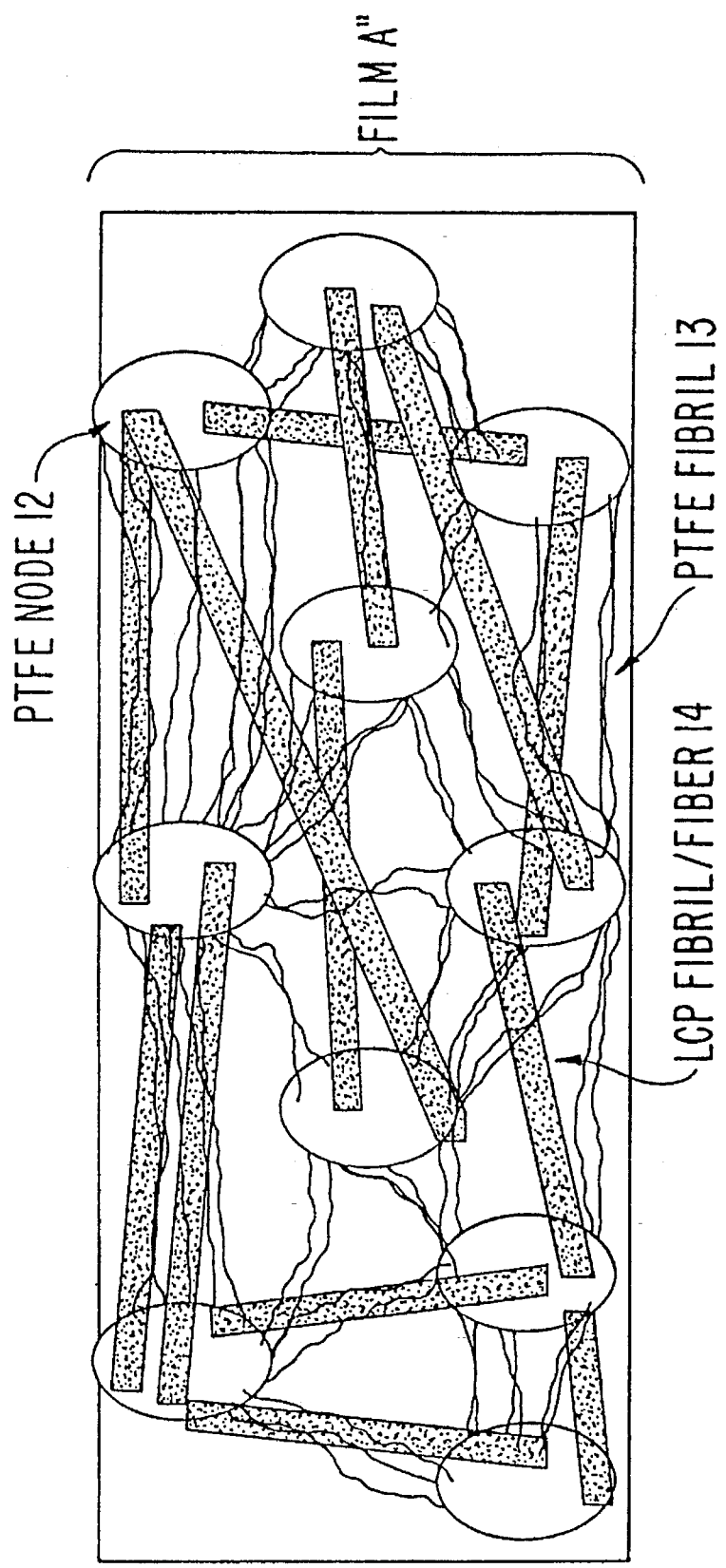
FIG. 4 is a cross-sectional view of the structure of Film A", which is the sheet of FIG. 2 after it is stretched at a temperature above the melting point of the LCP, illustrative of the node 12 and fibril 13 structure of expanded polytetrafluoroethylene as well as the interconnected network of LCP fibers/fibrils.
Figure 9:
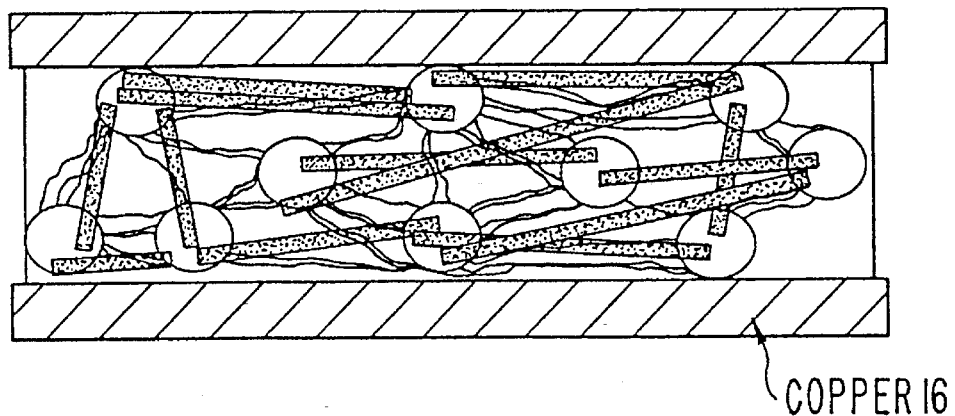
FIG. 9 is a cross-sectional view of Film A" of FIG. 4 with metal layers 16 bonded on both sides.

Film A of FIG. 2 is expanded above the melting point of the LCP particulate to provide Film A" shown in FIG. 4. Film A" has a porous microstructure of nodes 12 and fibrils 13 of expanded polytetrafluoroethylene as well as an interconnected network of LCP fibers/fibrils 14 (denoted by bar lines) intertwined within and attached to the above-mentioned PTFE microstructure. Thus, FIG. 4 illustrates the structure wherein the LCP particulate filler has been stretched and oriented. Film A" in FIG. 4 can then be laminated to at least one layer of a metal conductor to provide a useful PWB substrate as illustrated in FIG. 9. In FIG. 5, the open volume defined by the porous stretched structure of film A" in FIG. 4 is at least partially replaced by a polymer resin adhesive to form film A'''. Film A''' in FIG. 5 can then be laminated to at least one layer of a metal conductor to provide a useful PWB substrate as illustrated in FIG. 10.

Figure 10:
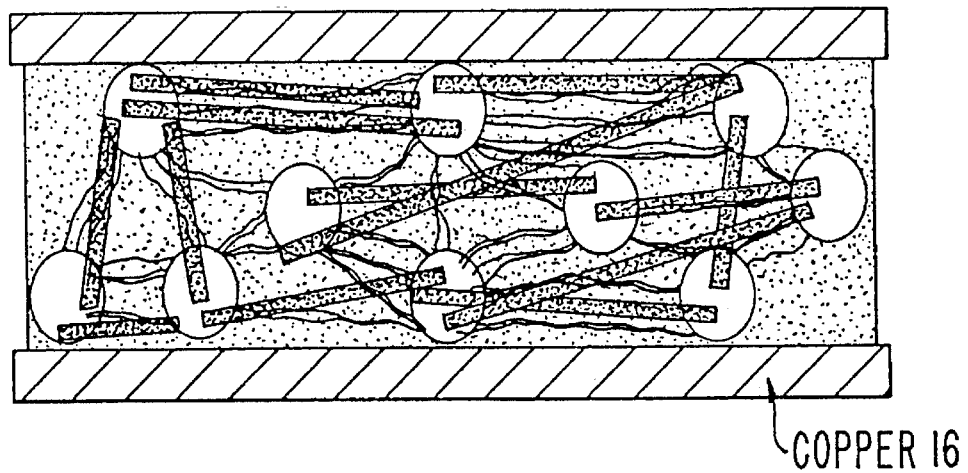
FIG. 10 is a cross-sectional view of Film A''' of FIG. 5 with metal layers 16 bonded on both sides.
Figure 11:
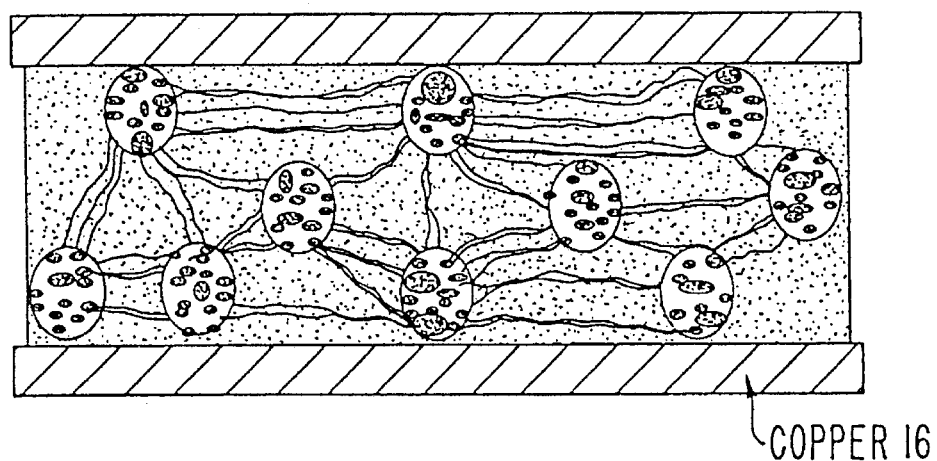
FIG. 11 is a cross-sectional view of Film A'''' of FIG. 6 with metal layers 16 bonded on both sides.

In FIG. 6, the open volume of film A' of FIG. 3 is filled with an adhesive polymer to form film A'''' and, in FIG. 10, film A'''' is laminated to copper sheets or traces 16.

The porous LCP-filled ePTFE film of the invention is prepared in the following manner.

The LCP filler is used in particulate form and is ordinarily less than 40 microns in size, preferably having an average particulate size between 1 and 15 microns. The filler is mixed with PTFE particulate in an amount that will provide 2 to 85, preferably 15 to 55, volume percent LCP in the mixture.

The particulate LCP can be chosen from the general class of main chain nematic LCP, and especially the thermotropic or lyotropic type. The main types of LCP particulate especially preferred in the present invention can be described by, but are not limited to, poly(benzoate-naphthoate copolymers, poly(naphthaoate-aminophenolterphthalate) copolyester-amide, poly(benzoatebiphenol) copolyester, and poly-(benzoate-ethyleneterephthalate) copolyester. These can be illustrated by the following chemical structures.

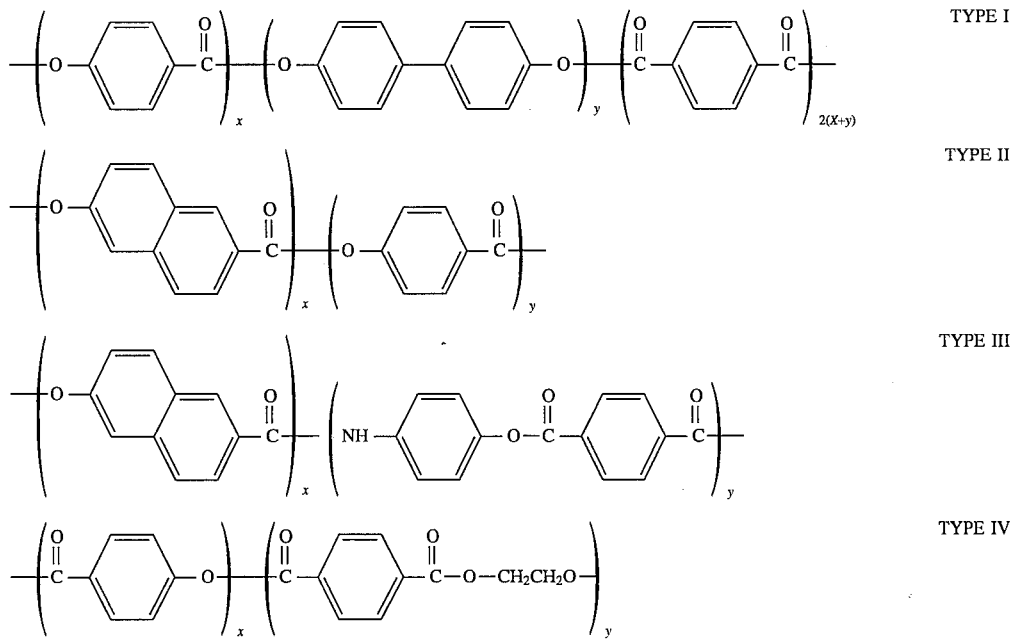

TYPE I

TYPE II

TYPE III

TYPE IV

A fine powder PTFE resin is combined with LCP particulate through one of two methods. In one method, fine powder PTFE resin, LCP particulate, and a lubricating liquid, such as mineral spirits, are blended together to form a consistent mixture. Conventional mixing methods such as rolling or tumbling can be used.

In a preferred method, an aqueous dispersion of PTFE resin is used. Into the aqueous dispersion, the LCP particulate is added. The mixture is co-coagulated, i.e., the PTFE resin is coagulated in the presence of the LCP particulates by rapid shearing of the aqueous dispersion, or through destabilization of the aqueous dispersion with salt, acid, polyethylene imine, or the like. A coagulum of fine powder PTFE resin and LCP particulate is formed and subsequently dried into cakes. When dry, the cakes are crumbled, screened, and blended with a lubricating liquid, such as mineral spirits and the like, to form a consistent mixture.

The mixture produced by either of the previously described methods is compressed into a billet and subsequently extruded through a die by a ram-type extruder to form a coherent extrudate. The extruded article thus formed is generally in the form of a rod or tape. The mineral spirit functions as an extrusion lubricant for the mixture.

The coherent extruded article can be optionally compressed between a pair of calender rolls to reduce its thickness. Subsequently the extrusion lubricant is removed from the coherent article, generally by heating or other conventional methods, for example, by passing the coherent article over a series of heated rollers to volatilize the extrusion lubricant, thus providing a dried porous coherent article. Other well known methods, such as solvent extraction, oven heating, and the like, can also be used.

The dried porous coherent extruded and/or calendered article can be stretched to further increase porosity, strength, or formation of a network of LCP fibers/fibrils within and connected to a porous microstructure of nodes interconnected by fibrils formed by the PTFE using the method of expanding PTFE taught in U.S. Pat. No. 3,543,566 (Gore) incorporated herein by reference.

The porous films are easily imbibed with other resins. In this case, all or part of the void volume can be replaced with a resin. The resin can be a thermosetting or thermoplastic polymer including, but not limited to, polyglycidyl ether, polycyanurate, polyisocyanate, bis-triazine resins, poly (bis-maleimide), norbornene-terminated polyimide, acetylene-terminated polyimide, polybutadiene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof. It should be understood that the aforementioned thermoplastic or thermosetting polymer resins may themselves be blended together or blended with other polymers or additives, so as to impart flame retardancy or enhanced toughness. In FIGS. 5 and 6, this space is shown filled with an adhesive resin. In the case where only part of the void volume of air is replaced with resin, the final composite can be compressed to a very thin, void-free composite with excellent adhesive properties. The ultimate thickness, degree of adhesion, and final compositional mixture is not to be achieved any other way.

In processing plastic materials of synthetic polymers it has long been recognized that orientation sensitive physical properties, in particular tensile properties and coefficient of thermal expansion (CTE) can be increased or otherwise improved by drawing or stretching the materials. When such a material is stretched uniaxially, i.e., in a single direction, the polymer becomes oriented in the direction of stretching, and the resultant orientation sensitive properties become increasingly anisotropic. This can be highly desirable for certain products, for example, in filaments, fibers, yarns and the like. Anisotropic properties are often not desirable, however, in other plastic products, such as tape, films, sheet and the like.

To achieve more balanced, less anisotropic, properties in synthetic polymer plastics the materials can be stretched in more than one direction. Biaxial stretching, in two directions usually perpendicular to each other, is often used. Biaxial stretching does not necessarily result in biaxial orientation of the materials such that the orientation sensitive properties are in exact correspondence with the directions of stretching.

An important aspect of the process invention lies in the use of the unusual ability of polytetrafluoroethylene (PTFE) to expand on stretching to form a porous material of interconnecting channels defined by the formation of nodes and fibrils. The stretching of polytetrafluoroethylene (PTFE) to form porous material is well known, being described in U.S. Pat. No. 3,543,566. The void space in expanded PTFE comprises at least 50% of the volume, and frequently more than 70%, and up to 90% in some instances. Because of the expansion, the filler particulates are drawn apart from one another as the PTFE is expanded. This reduces the opportunity for tears or pinholes to form as the PTFE is compressed and results in a thin, highly filled film.

This feature of the process invention is described and shown by reference to FIGS. 2, 3, and 4. In FIG. 2, an extruded PTFE film contains particulate filler. It is known from previous teachings that a node and fibril structure can be obtained by expanding such a film in at least one direction. If that expansion is performed below the melting point of the LCP, the LCP remains in the nodes as an unoriented particulate as depicted in FIG. 3. However, if expansion of the film of FIG. 2 is performed above the melting point of the LCP, the LCP is stretched into fibers oriented along the fibril paths between the PTFE nodes as shown in FIG. 4.

Figure 12:
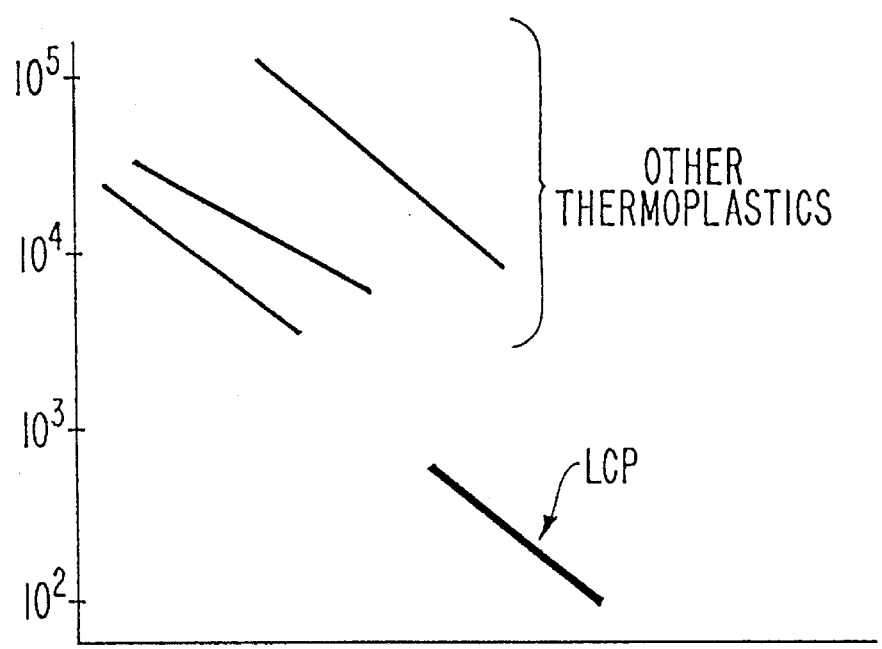
FIG. 12 is a graphic representation of the temperature versus shear viscosity relationship of LCP materials and other thermoplastic polymer materials.

The temperature versus shear viscosity relationship of LCP materials is well known (See FIG. 12). LCPs generally show an extraordinarily low viscosity at a given shear field when compared to other thermoplastic materials. In this invention, the internal shear created within the LCP, contained within the PTFE microstructure as it is being stretched, is such that the shear field is sufficient to change LCP particulate from a more or less round shape to a fibrous shape when the processing temperature is above the melt temperature of the LCP. A typical aspect ratio of the fibers can be, but is not limited to, about 20 to 1 to about 250 to 1. The fibrous shape of the LCP fibers imparts useful properties of strength and low shrinkage to the final composite.

The act of uniaxially or biaxially expanding the porous composite preform tape creates localized shear fields within the preform. This has several consequences to the present invention which are unique and surprising to those skilled in the art. Orientation of the LCP is being caused from within the porous composite tape. Even though the overall force exerted on the preform is in the machine (x) and/or the transverse (y) direction, as described in U.S. Pat. No. 3,543,566 to Gore, the force is redistributed at the microscopic scale to each point of the node and fibril structure. Consequently, the LCP experiences a gradient of shear fields which is quite different than that of the LCP prior art, where the shear fields employed to orient the LCP are due to the geometry of the surface of an extrusion die. Prior art relating to the orientation of LCPs deal with shear fields generated at or very near the surface of an extrusion die; and because of this, more orientation occurs where there is a larger shear field. This gradient of shear field causes a gradient of orientation which manifests itself in skinning effects and anisotropy in the x, y, and especially the z directions of the LCP films described in the prior art.

Even though the film is not being expanded in the z-direction, films of this invention display some orientation in the z-direction as well. This is surprising and unexpected, and is due to the fact that the orientation of the LCP fibers follows the path of the node and fibril microstructure of the PTFE created as the porous composite sheet is stretched. Isotropic reinforcement behavior is very desirable in dielectric materials for electronic printed wiring board applications, filter materials for filtration applications and for gasketing materials. To be sure, if one desires anisotropic behavior in the ultimate composite, it can readily be attained in this invention by creating an environment within the porous composite sheet, where the primary expansion of PTFE primary particulates is in a single direction.

TEST PROCEDURES

Dielectric constant (Dk) at frequencies less than 3 GHz was determined using a Hewlett-Packard 8753A Network Analyzer (Hewlett-Packard Corp., San Jose, Calif.) by the substrate resonance method on a copper-clad laminate.

Dielectric constant (Dk) and Dissipation Factor (Df) at frequencies above 5 GHz were determined using a resonant mode dielectrometer developed by GDK Products (GDK products Inc., Cazonvia, N.Y.) and a Hewlett Packard 8510 Network Analyzer (Hewlett-Packard Corp., San Jose, Calif.).

Copper Peel values were determined using a 90-degree peel configuration on a copper-clad laminate anchored to a rigid sliding plane substrate coupled to an Applied Test Systems Model No. 1401 computer-controlled tensile testing machine (Applied Test Systems Inc., Butler, Pa.).

Matrix Tensile modulus is defined as the observed modules of a thin film according to a modified D882 ASTM procedure, then dividing by the porosity of the sample.

Without intending to limit the scope of the present invention, the following examples illustrate how the present invention may be made and used.

EXAMPLE 1

A slurry of 872 g Xydar SRT-900 (Amoco Performance Products—Melting Point—350° C., first ground to a 325 mesh fine powder) described by chemical structure Type I above, and 20 liters of 50 Vol. % aqueous isopropanol was prepared in a 40 liter container. While the slurry was agitated at about 300 rpm, 2852 g PTFE in the form of an aqueous dispersion containing 24.7 wt. % PTFE solids (E. I. DuPont de Nemours & Co., Inc.) was rapidly poured into the mixing vessel. The mixture self-coagulated within 5 minutes and the cocoagulation was complete, i.e, there was no residual uncoagulated PTFE. The coagulation was gently poured over a porous cheesecloth and allowed to air dry. The filtrate from this process was clear.

The coagulum was dried 16 hours at 165° C. in a convection oven. The material dried in small, cracked cakes approximately 2 cm thick and was chilled to about 2° C. The chilled cake was hand-ground using a tight, circular motion and minimal downward force through a 0.635 cm. mesh stainless steel screen, then 0.231 g of mineral spirits per gram of powder was added. The mixture was again chilled and again passed through a 0.635 cm. mesh screen, tumbled for 5 minutes, then allowed to sit at 18° C. for 48 hours, after which it was retumbled for 5 minutes.

The coagulum lubricated with mineral spirits was then formed into a tape by conventional paste forming methods as follows:

A 3.9 pound pellet was formed in a cylinder by applying a vacuum and pressing at 880 psi. The pellet was then heated to 40° C. in a sealed tube. The pellet was then extruded to form a 6 inch wide ×0.080 inch thick tape. The tape was then calendered to a thickness of 0.017 inch. The lubricant was evaporated by running the tape across heated rolls and a porous composite tape was produced. The tape was stretched in the machine direction, first at a 2 to 1 stretch ratio over a heating surface at 380° C., 35 ft./min., then again at a 2 to 1 ratio, with the heating surface at 380° C., 35 ft./min., and finally at a 1.1 to 1 ratio, with the heating surface at 380° C., 35 ft./min. The porous film thus obtained had a thickness of 0.007 inch and marked strength and toughness. The porous film was measured for matrix tensile strength, air permeability, porosity, and ball burst force and the results are shown in row 4 of Table 1.

EXAMPLE 2

A tape was made as described in Example 1 above, except that the tape was stretched in the machine direction, first at a 10 to 1 stretch ratio, 380° C., 35 ft./min., then a second stretch at a 2 to 1 ratio, 380° C., 35 ft./min., and a final stretch at 1.1 to 1 ratio, 380° C., 35 ft./min. The film thus obtained displayed a thickness of 0.0015 inch and marked strength and toughness. The porous film was measured for matrix tensile strength, air permeability, porosity, ball burst force and the results are shown in row 5 of Table 1.

EXAMPLE 3

A slurry of 19 g Vectra A950 (Hoechst Celanese Corp.— Melting Point—280° C., first ground to a 325 mesh fine powder) described by chemical structure Type III, and 600 ml of 50 vol. % aqueous isopropanol was prepared in a 4 liter container. While the slurry was agitated at about 900 rpm, 137 g PTFE in the form of an aqueous dispersion containing 24.7 wt. % PTFE solids (E. I. DuPont de Nemours & Co., Inc.) was rapidly poured into the mixing vessel. The mixture was self-coagulating, and within 5 minutes co-coagulation was complete. The coagulum was poured over a porous cheesecloth and allowed to air dry. The filtrate from this process was clear.

The coagulum was dried 16 hours at 165° C. in a convection oven. The material dried in small, cracked cakes approximately 2 cm. thick and was chilled. The chilled cake was hand-ground using a tight, circular motion and minimal downward force through a 0.635 cm. mesh stainless steel screen, then 0.231 g of mineral spirits per gram of powder was added. The mixture was chilled, again passed through a 0.635 cm. mesh screen, tumbled for 5 minutes, then allowed to sit at 18° C. for 48 hours and was retumbled for 5 minutes.

A 150 g pellet was formed in a cylinder by pulling a vacuum and pressing at 300 psi. The pellet was then heated in a sealed tube as described in Example 1. The pellet was then extruded into a 0.040"×0.375" tape form. The tape was then calendered through rolls to a thickness of 0.019 inch. The lubricant was evaporated by running the tape across heated rolls. The tape was stretched in the machine direction; first at a 3 to 1 ratio, with heating surfaces at 340° C., 75 ft./min; then at a 15 to 1 ratio, with heating surfaces at 340° C., 75 ft./min. The porous film thus obtained had a thickness of 0.002 inch and marked strength and toughness.

EXAMPLE 4

A slurry of 1375 g Xydar SRT-900 (Amoco Performance Products, first ground to a fine powder), and 20 liters of 50 vol.% aqueous isopropanol was prepared in a 120 liter container. While the slurry was agitated at about 300 rpm, 12234 g PTFE in the form of an aqueous dispersion containing 35.5 wt.% solids (E. I. DuPont de Nemours & Co., Inc.) was rapidly poured into the mixing vessel. The mixture was self-coagulating, and within 5 minutes co-coagulation was complete. The coagulum was gently poured over a porous cheesecloth and allowed to air dry. The filtrate from this process was clear.

The coagulum was dried 16 hours at 165° C. in a convection oven. The material dried in small, cracked cakes approximately 2 cm. thick and was chilled. The chilled cake was hand-ground using a tight, circular motion and minimal downward force through a 0.635 cm. mesh stainless steel screen, then 0.231 g of mineral spirits per gram of powder was added. The mixture was chilled, again passed through a 0.635 cm. mesh screen, tumbled for 5 minutes, then allowed to sit at 18° C. for 48 hours and was retumbled for 5 minutes.

A 29 pound pellet was formed in a cylinder by pulling a vacuum and pressing at 880 psi. The pellet was then heated in a sealed tube as described in Example 1. The pellet was then extruded into a 6"×0.080" tape form. The tape was then calendered through rolls to a thickness of 0.017 inch. The lubricant was evaporated by running the tape across heated rolls. The tape was stretched in the machine direction; first at a 1.1 to 1 ratio, with heating surfaces at 380° C., 20 ft./min; then at a 2.5 to 1 ratio, with heating surfaces at 380° C., 20 ft./min; and finally at a 2.5 to 1 ratio, with heating surfaces at 380° C., 20 ft./min. The porous film was then stretched in the transverse direction at a 5.0 to 1 ratio, with heating surfaces at 220° C., 35 ft./min. The film thus obtained had a thickness of 0.005" and marked strength and toughness in both directions. Physical property measurements were made and the results are shown in Table 1 row 6.

EXAMPLE 5

A biaxially-stretched film was made as in Example 4 above, except that it was stretched simultaneously in both directions by first heating the sample to 320° C., then stretching 3.5 to 1 in both directions at once. The porous films thus obtained had a thickness of 0.002". Physical property measurements were made and the results are shown in Table 1, row 2.

EXAMPLE 6

The expanded filled film from Example 1 was then laid up 191 mils thick between copper foil and pressed at 250 psi in a vacuum-assisted hydraulic press at a temperature of 330° C. for 90 minutes, then cooled under pressure. This resulted in a copper laminate having a dielectric constant of 2.2 at 0.1" (100 mil) dielectric laminate thickness. The dielectric layer had a density of 1.81 g/cm$^3$. Physical property measurements were made and the results are shown in Table 2, row 3.

EXAMPLE 7

The expanded filled film from Example 4 was then laid up 20 plies thick between copper foil and pressed at 250 psi in a vacuum-assisted hydraulic press at a temperature of 330° C. for 90 minutes then cooled under pressure. This resulted in a copper laminate having dielectric constant of 2.1 at 0.1" (100 mil) dielectric laminate thickness. The dielectric layer had a density of 1.7 g/cm$^3$. Physical property measurements were made and the results are shown in Table 2, row 2.

EXAMPLE 8

The dried calendered filled film from Example 1 (before expansion) was laid up 12 plies of 10 mil each between copper foil and pressed at 250 psi in a vacuum assisted press for 90 minutes at 330° C., then cooled under pressure. The resulting composite thus obtained displayed a dielectric constant of 2.1, density of 1.90 g/cm³ and thickness of 85 mil.

EXAMPLE 9

The dried calendered filled film from Example 4 (before expansion) was laid up 13 plies of 14 mil each between copper foil and pressed at 250 psi in a vacuum assisted press for 90 minutes at 330° C., then cooled under pressure. The resulting composite thus obtained displayed a dielectric constant of 2.0, density of 1.90 g/cm³ and thickness of 101 mil.

EXAMPLE 10

The film obtained from Example 1 was then dipped into a 10.0 (w/w) solution of a manganese-catalyzed flame retarded bis-triazine resin (BT2060BJ, Mitsubishi Gas Chemical) in MEK, constrained in plane on a tenterframe, and heated for 2 min. at 163° C. to form a B-staged prepreg. Several plies of the B-staged prepreg were then laid up between copper foil and pressed at 250 psi in a vacuum-assisted hydraulic press at a temperature of 225° C. for 90 mins. The resulting composite thus obtained displayed a dielectric constant of 2.8, density of 1.7 g/cm³ thickness of 22.7 mil. Test results are found in Table 3, row 3.

EXAMPLE 11

The film obtained from Example 4 was then dipped into a 10% (w/w) solution of a manganese-catalyzed, flame retarded bis-triazine resin (BT2060B Mitsubishi Gas Chemical), constrained in plane on a tenter frame, and heated for 2 min. at 155° C. to form a B-staged prepreg. The B-staged prepreg was then laid up 23 plies (dielectric thickness =1.8 mil) between copper foil and pressed at 250 psi in a vacuum-assisted hydraulic press at a temperature of 225° C. for 90 minutes. This resulted in a copper laminate having a Dk of 2.9, density of 1.7 and thickness of 21.1 mil.

CONTROL SAMPLES

Control samples of expanded polytetrafluoroethylene film were prepared and tested for comparative purposes. Test results are shown in Tables 1–3.

Control Sample 1 is a biaxially stretched porous expanded polytetrafluoroethylene film. The film is about 0.0075 inches (0.019 cm) thick, and has a weight of about 80 g/m² and a pore volume of about 81%.

Control Sample 2 is the porous PTFE film of Control Sample 1 after heating it to a temperature in the range 350–385° C.

Control Sample 3 is the porous PTFE film of Control Sample 1 which has been impregnated with bis-triazine resin and processed as described in Examples 10 and 11.

TABLE 1

Physical Properties of Substrate Films

| Description | Porosity (%) | Matrix Tensile Moduli (psi) | Gurley (sec) | Ball Burst (lb) |
|---|---|---|---|---|
| Control Sample 1 | 81 | 1000 | 26 | — |
| Example 5 - Stretched below Tm of LCP - 15% LCP | 91 | — | <1 | 10 |
| Stretched below Tm of LCP - 30% LCP | 90 | — | <1 | 11 |
| Example 1 | 81 | 4,800 | 4 | 51 |
| Example 2 | 86 | 500,000 | 3 | 23 |
| Example 4 | 83 | 33,000 | 6 | >56 |

TABLE 2

Physical Properties of Laminated Substrate Films

| Description | DK @ 10 MHz | DF @ 10 GHz | CTE - "X" direction (ppm/°C.) | CTE - "Y" direction (ppm/°C.) | CTE - "Z" direction (ppm/°C.) | Density (g/cm³) |
|---|---|---|---|---|---|---|
| Control Sample 2 | 2.0 | 0.0003 | 106 | 114 | 138 | 2.16 |
| Example 7 | 2.2 | .0007 | 17 | 120 | 140 | 2.04 |
| Example 6 | 2.4 | .0011 | 14 | 109 | 114 | 1.81 |
| Example 1 | 2.4 | .0010 | 65 | 90 | 156 | 1.90 |
| Example 2 | 2.2 | .0011 | 10 | 123 | 140 | 1.84 |
| Example 5 - Expanded below Tm of LCP - 15% LCP | 2.2 | 0.0008 | 92 | 101 | 113 | 1.95 |
| Expanded below Tm of LCP - 30% LCP | 2.3 | 0.0013 | 76 | 74 | 113 | 1.90 |

TABLE 3

| Description | Physical Properties of PTFE/LCP/Adhesive Laminated Dielectrics | | | | |
|---|---|---|---|---|---|
| | Dk | CTE "x"-direction (ppm/°C.) | CTE "y"-direction (ppm/°C.) | CTE "z"-direction (ppm/°C.) | Copper Peel (pli) |
| Control Sample 3 | 2.8 | 52 | 50 | 73 | >6 |
| Example 10 | 2.8 | 29 | 47 | 42 | >6 |
| Example 11 | 2.9 | 51 | 63 | 72 | >6 |

While particular embodiments of the present invention have been illustrated and described herein, the present invention should not be limited to such illustrations and descriptions. It should be apparent that changes and modifications may be incorporated and embodied as part of the present invention within the scope of the following claims.

I claim:

1. A porous composite sheet comprising:

(a) polytetrafluoroethylene; and (b) liquid crystal polymer;

said sheet formed from a mixture of polytetrafluoroethylene particulate and liquid crystal polymer particulate;

said sheet having a concentration of liquid crystal polymer in the range 2 to 85 volume percent.

2. The porous composite sheet of claim 1 wherein the liquid crystal polymer is a thermotropic nematic liquid crystal polymer.

3. The porous composite sheet of claim 2, wherein the liquid crystal polymer is contained within a porous microstructure of polytetrafluoroethylene;

said liquid crystal polymer being in particulate form.

4. The porous composite sheet of claim 3, wherein the polytetrafluoroethylene is expanded polytetrafluoroethylene having a microstructure of nodes interconnected by fibrils.

5. The porous composite sheet of claim 4, wherein the liquid crystal polymer forms a microstructure of liquid crystal polymer fibers attached to and disposed within the microstructure of nodes interconnected by fibrils of the polytetrafluoroethylene.

6. The porous composite sheet of claim 1 further comprising a polymeric adhesive resin, wherein at least a portion of the void volume of the porous sheet is replaced with said polymeric adhesive resin.

7. The porous composite sheet of claim 2 further comprising a polymeric adhesive resin, wherein at least a portion of the void volume of the porous sheet is replaced with said polymeric adhesive resin.

8. The porous composite sheet of claim 3 further comprising a polymeric adhesive resin, wherein at least a portion of the void volume of the porous sheet is replaced with said polymeric adhesive resin.

9. The porous composite sheet of claim 4 further comprising a polymeric adhesive resin, wherein at least a portion of the void volume of the porous sheet is replaced with said polymeric adhesive resin.

10. The porous composite sheet of claim 5 further comprising a polymeric adhesive resin, wherein at least a portion of the void volume of the porous sheet is replaced with said polymeric adhesive resin.

* * * * *